United States Patent [19]
Nairn

[11] Patent Number: 6,037,888
[45] Date of Patent: Mar. 14, 2000

[54] HIGH ACCURACY DIGITAL TO ANALOG CONVERTER COMBINING DATA WEIGHTED AVERAGING AND SEGMENTATION

[75] Inventor: David Graham Nairn, Kingston, Canada

[73] Assignee: PMC-Sierra Ltd., Burnaby, Canada

[21] Appl. No.: 09/045,704

[22] Filed: Mar. 23, 1998

[51] Int. Cl.[7] .............................. H03M 1/66; H03M 1/78
[52] U.S. Cl. ........................................... 341/145; 341/154
[58] Field of Search .................................... 341/143, 144, 341/145, 158, 120, 153, 154

[56] References Cited

U.S. PATENT DOCUMENTS

| | | | |
|---|---|---|---|
| 4,804,960 | 2/1989 | Fernandes et al. | 341/158 |
| 4,958,155 | 9/1990 | Gulczynski | 341/120 |
| 5,818,377 | 10/1998 | Wieser | 341/144 |

OTHER PUBLICATIONS

Baird et al, "Linearity Enhancement . . . Using Data Weighted Averaging," IEEE, Dec. 1995.

*Primary Examiner*—Brian Young
*Assistant Examiner*—Patrick Wamsley
*Attorney, Agent, or Firm*—Pascal & Associates

[57] ABSTRACT

A method of digital to analog conversion comprising switching binary weighted groups of first current sources of a first array of sources to an output in accordance with least significant bits of a digital input signal, driving the binary weighted groups with a driving current source selected from a second group of current sources in accordance with a counter value which is based on a value of most significant bits of the input signal added to a immediately preceding counter value, and driving an output with current sources which are addressable consecutively to the driving current source.

9 Claims, 3 Drawing Sheets

HIGH ACCURACY DIGITAL TO ANALOG CONVERTER COMBINING DATA WEIGHTED AVERAGING AND SEGMENTATION

FIELD OF THE INVENTION

This invention relates to an improved digital to analog converter (DAC) which can be implemented in an integrated circuit.

BACKGROUND TO THE INVENTION

A DAC accepts an N-bit digital input signal, and ideally produces $2^N$ analog output signals uniformly spaced in time. While DACs can be implemented to produce either a voltage or current output signal, a DAC which produces a current output signal has been conceptually easier to implement. Current output DACs are typically implemented with an array of switches, and either a binary weighted array of current sources or unit current sources. The accuracy of the resulting DAC depends on how accurately the individual current sources can be matched. With a careful layout, device matching suitable for 10-bit accuracy can be expected. To obtain higher resolutions, special design techniques are required.

One of the earliest techniques for increasing the accuracy of a DAC is described in "An Inherently Monotonic 12 bit DAC", by J. A. Schoeff, IEEE Journal of Solid State Circuits, Vol SC-14, No 6, pp 904–911, December 1979, which uses a "segmented" approach. An N+M bit segmented DAC uses an M-bit binary weighted DAC for the least significant bits and $2^N$ unit current sources for the most significant bits of an input signal. One of the unit current sources is used to feed the binary weighted DAC. This ensures that the range of the binary weighted DAC is equal to one unit current source. By switching the unit current sources to the binary weighted DAC or directly to the output, depending on the input code, a high resolution monotonic DAC is stated to be achieved.

However, a problem with this approach is that the unit current sources are not perfectly matched. These mismatches lead the DAC to display an integral non-linearity at DC, and harmonic distortion for time varying signals.

A method of circumventing the problem of mismatched unit current sources in a segmented DAC is described in "A Low-Power Stereo 16-bit CMOS D/A converter for Digital Audio", by H. J. Schouwenaars et al, IEEE Journal of Solid State Circuits, Vol SC-23, No 6, pp.1290–1297, December 1988. The authors propose that the outputs of the unit current sources should be averaged. This requires that the outputs of the unit current source array should be switched between the binary weighted DAC and the direct output during each output period. The switching is done in a manner so that the direct output and the binary weighted DAC each see the average of the currents provided by the unit current sources.

While this approach increases the linearity of the circuit, the unit sources must be switched faster than the output of the DAC, thereby reducing the maximum speed of operation of the DAC. In addition, sizeable off-chip capacitors are required to filter the ripple caused by the switching.

A completely different approach to achieving high linearity in a DAC which is based on an array of unit elements, is based on data weighted averaging (DWA), described by O. Nys et al in "A 19-bit Low-Power Multibit Sigma-Delta ADC Based on Data Weighted Averaging", IEEE Journal of Solid State Circuits, Vol. SC-32, No.7, pp.933–942, July 1997. DWA uses an array of unit current sources (or capacitors) each of which can be driven separately.

Like a traditional DAC based on unit current sources, the appropriate number of elements in the array is switched to the output for each input code. Unlike traditional DACs, in which the same code will cause the same elements to be switched to the output, the elements that are switched to the output in a DWA DAC are dependent on the previous inputs. In particular, the elements are used sequentially in such manner that all elements are used in the array before starting at the beginning of the sequence again.

This approach has two benefits: firstly that the errors in the unit current sources are converted from linearity errors to noise. This has the effect of linearizing the DAC. In addition, the resulting noise is not white noise. Instead, the noise displays what is called first order noise shaping which yields a 9 dB improvement in in-band noise for each doubling of the sampling rate of the DAC. Hence, a relatively low over-sampling ratio is required to significantly improve the in-band signal-to-noise ratio and linearity of a DAC.

The second benefit is the simplicity of the transformation algorithm. The algorithm simply has to keep track of the last element used in the array, and is implemented with what is called a "cycle counter".

The primary problems with DWA for high resolution DACs are the large number of unit devices that are required to be used, and the large cycle counter, both of which consume a large integrated chip area.

SUMMARY OF THE INVENTION

The present invention utilizes DWA for the N most significant bits of a digital input signal, and combines it with a binary weighted stage for the M least significant bits of the input signal. In accordance with the manner of combination, the above-described problems of the previous designs described above have been overcome.

In particular, the present invention achieves a high resolution DAC that does not require post process trimming, or continuous calibration. A DAC with 12-bit performance (i.e. with a signal-to-noise ratio larger than 72 dB) can be achieved for signals between 30 kHz and 1.1 MHz. The number of unit current elements or capacitors is minimized, thus minimizing the area of the DAC, allowing the DAC to be used as a sub-block in a much larger single-chip system. The improvement by 2-bits to 12-bit performance in the present invention over previous 10-bit performance (smaller signal-to-noise ratio) without significantly increasing the required die area of the DAC and without requiring post process trimming is believed to be a significant achievement.

In accordance with an embodiment of the present invention, a method of digital to analog conversion comprises switching binary weighted groups of first current sources of a first array of sources to an output in accordance with least significant bits of a digital input signal, driving the binary weighted groups with a driving current source selected from a second group of current sources in accordance with a counter value which is based on a value of most significant bits of the input signal added to a immediately preceding counter value, and driving an output with current sources from said second group of current sources which are addressable consecutively to the driving current source.

In accordance with another embodiment, a DAC circuit comprises a DAC having binary weighted switched current sources or capacitors controlled by least significant bits of a digital input signal comprised of N most significant bits and M least significant bits, a data weighted averaging (DWA) stage comprised of an array of separately switchable unit current sources or capacitors, a circuit for causing switching of unit current sources or capacitors to an output and causing one unit source to drive the DAC, the number and designation of the unit current sources or capacitors switched being dependent on the value of the N most significant bits of the input signal combined with a designation of unit current sources or capacitors which were previously switched.

In accordance with another embodiment, A digital to analog converter (DAC) comprises a first array of sources, a first plurality of switches for switching binary weighted groups of said first array to an output in accordance with least significant bits of a digital input signal comprised of N most significant and M least significant bits, a second array of current sources, and a circuit for switching one of the sources of the second array of sources via a second plurality of switches to drive the first array of sources and for switching other sources of the second array of sources to the output, the number of said other sources being equal to the value of the N most significant bits of the input signal, and addresses of the switched sources being consecutive and being dependent on both a value of N and the highest address of the previously switched sources.

BRIEF DESCRIPTION OF THE DRAWINGS

A better understanding of the invention will be obtained by a consideration of the detailed description below, in conjunction with the following drawings, in which.

DETAILED DESCRIPTION OF THE INVENTION

Figure 1:
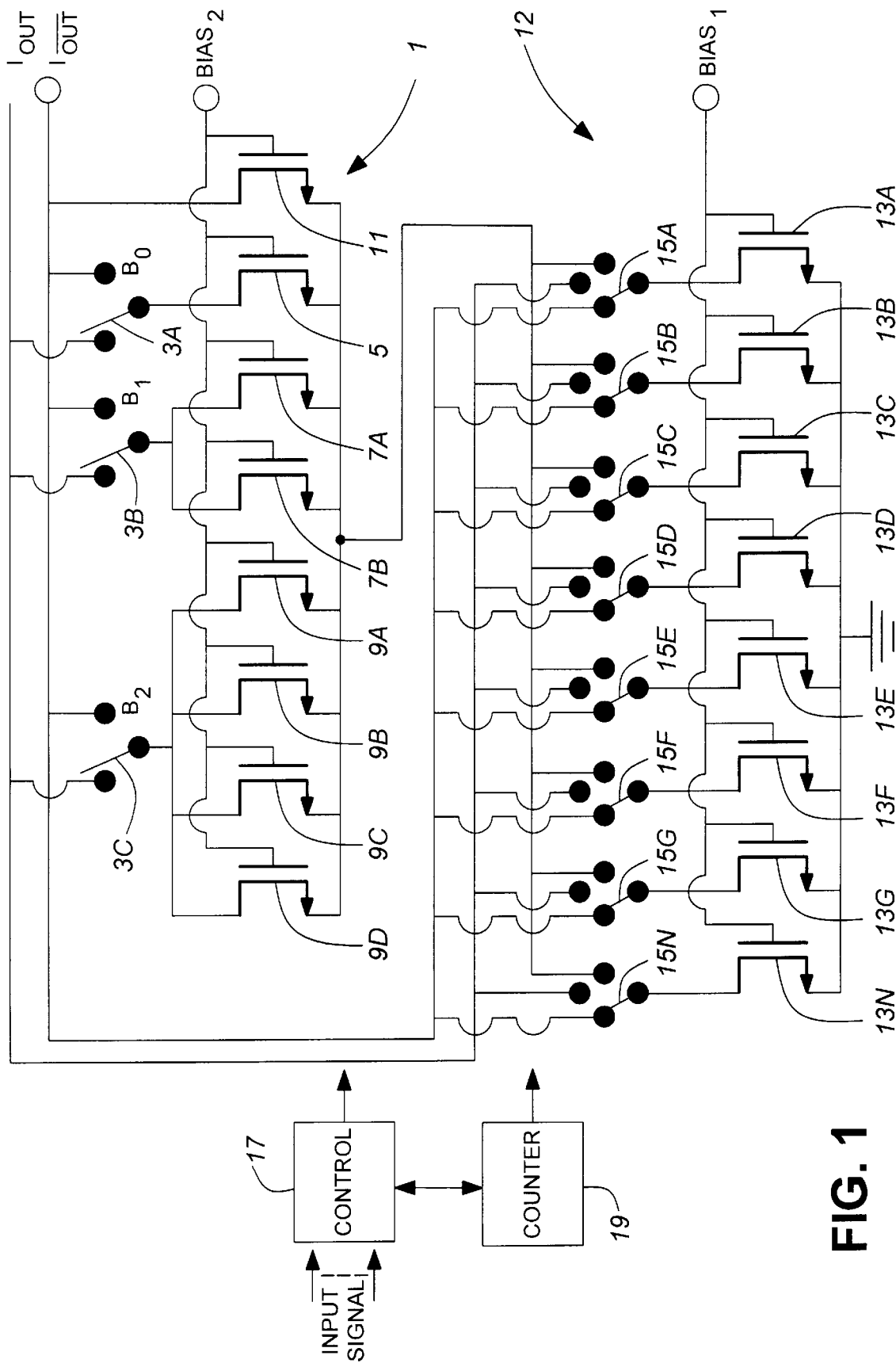
FIG. 1 is a schematic diagram of a DAC in accordance with an embodiment of the invention.

Turning to FIG. 1, a binary weighted DAC 1 is illustrated. The DAC is comprised of a plurality of switches 3A, 3B and 3C each of which couple a number of field effect transistors (FETs) to an output Iout, the number of FETs in each group being determined by binary weighting. For example, switch 3A is connected to a single ($2^0$) FET 5, switch 3B is connected to a pair ($2^1$) of FETs 7A and 7B, and switch 3C is connected to four ($2^2$) FETs 9A, 9B, 9C and 9D. The FETs of each group connected to a switch have their source-drain circuits connected in parallel. The sources of all of the FETs of the N-channel FETs shown in this embodiment all are connected together. A bias voltage (Bias 2) is applied to all of the gates of the FETS, in order to cause the source-drain circuits to be of high impedance, and therefore act as current sources.

The switches 3A, 3B and 3C are shown as single pole-double throw types, connecting FETs not connected to the output Iout to an inverse of Iout: Iout. As a convention in this specification, connection to an output will mean connection to Iout, with all FETs not connected to Iout and not being designated to be connected to another node, being connected to Iout.

An additional unswitched FET 11 is connected to Iout to ensure current supplied to DAC 1 is divided into exactly $2^N$ equal parts (i.e. 8 equal parts for this example) and not $2^N-1$ as would be the case without FET 11.

In an array 12 of unit current sources, current sources comprised of FETs 13A to 13N each have their respective source-drain circuits individually switched by corresponding switches 15A to 15N to either the common connection of the sources of the FETs of DAC 1 or to the output Iout (and the remaining source-drain circuits to Iout). In the embodiment illustrated, the sources of the N-channel FETs 13A to 13N are connected together and to ground.

An input signal, comprised of M least significant bits and N most significant bits, is applied to a control circuit 17. The control circuit 17 controls operation of switches 3A to 3C and 15A to 15N, in a manner to be described below. In addition, a cycle counter 19 maintains a count depending on a value of the most significant bits and the previous count, and provides the count value to the control circuit 17 to aid in indicating the address of which switches 15A–15N of the unit current sources 13A–13N should be operated.

In general, the addresses of switches 3A to 3C that are operated in the binary weighted DAC 1 are indicated directly by the value of the least significant M bits of the input signal. The most significant N bits drive the number of unit current sources determined by $2^N$.

For any particular N most significant bits of the input signal code, one of the unit current sources is switched to drive the binary weighted current array in DAC 1. Thus for example, briefly turning to FIGS. 2A and 2B, only switch 15N in FIG. 2A and only switch 15E in FIG. 2B have been switched to a position where it is connected to the sources of the FETs of DAC 1, and can thereby drive it.

In addition, the number of unit current sources 13A to 13N switched to the output Iout is equal to the value of the N most significant bits of the input signal. For example in FIG. 2A this value is equal to 2 (switches 15F and 15G), and in FIG. 2B this value is equal to 4 (switches 15A–15D).

The selection of which unit current sources 13A–13N should be switched implements data weighted averaging (DWA), and depends on both the current input code and on the net result of all previous input codes. The counter 19 need only keep track of the value (and thus the identity, i.e. address) of the last switch in a sequence connected to the output Iout, and thus can designate the next switch to connect an FET of the unit current sources to drive the DAC array 1.

To start, the unit current sources are numbered from 1 to $2^N$ (13N to 13A), and the counter 19 is set to $2^N$. For the first code word, the required number of unit current sources $k_1$ to be connected to the output, $k_1$, is determined. Then the first $k_1$ unit current sources are activated by switching the associated switches to the output Iout, and the counter 19 is increased by $k_1+1$ (modulo $2^N$), yielding a count of $k_1+1$.

For the next code word, the required number of unit sources $k_2$ to be connected to the output Iout, is determined from the value of the most significant bits. Then the next $k_2$ unit current sources following those previously switched are activated by switching them to the output Iout in place of those previously switched for the first code word. The counter is increased by $k_2$ to $k_1+k_2$.

For each subsequent code word, the required number of unit sources, $k_i$, is determined. Then the next $k_i$ current sources following the one pointed to by the counter, are activated as described above, while the source pointed to by the counter is directed to DAC 1. Then the counter is increased by $k_i+1$.

In this manner the unit current sources in the most significant bit array are used in sequence to implement data weighted averaging, and thus achieve improved in-band signal to noise ratio of the overall DAC circuit.

Figure 2A:
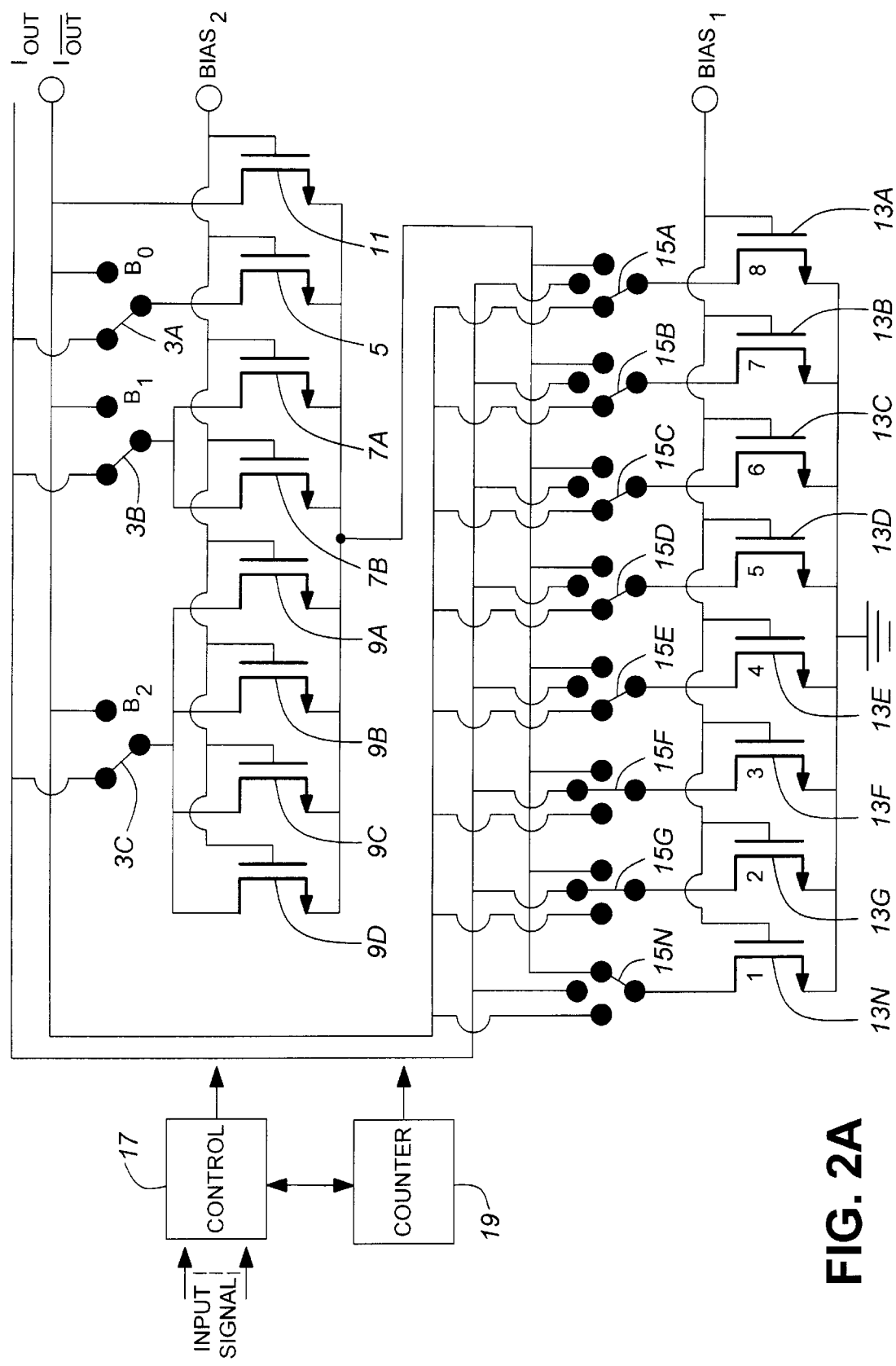
FIGS. 2A and 2B are schematic diagrams of a DAC of the invention in two stages of operation respectively.

As an example, reference is now made to FIG. 2A, showing a 3+3 bit DAC. The example input signal is 010111. The three most significant bits, N=010=2. This value indicates the number of unit current sources 13 to be connected to the output Iout.

The initial count in the counter=0. This designates the identity (i.e. the address) of the unit current source to be switched to drive the DAC 1, unit source 13N. The control 17 thus causes switch 15N to switch FET 13N to the common sources of the FETs of binary weighted DAC 1.

The two unit current sources to be switched to the output Iout preferably immediately follow in sequence the one switched to the common sources of the FETs of DAC 1, e.g. switches 15G and 15F switch FETs 13G and 13F to Iout.

The remaining FETs 13A to 13E are switched to the complement output node Iout by switches 15A–15E.

Since the identity of the last switch in the sequence which has been switched to the output Iout is known to the control 17 from counter 19 (i.e. 0+(1+2)=3), that provides an initial count from which the switches for the next input signal are determined.

Figure 2B:
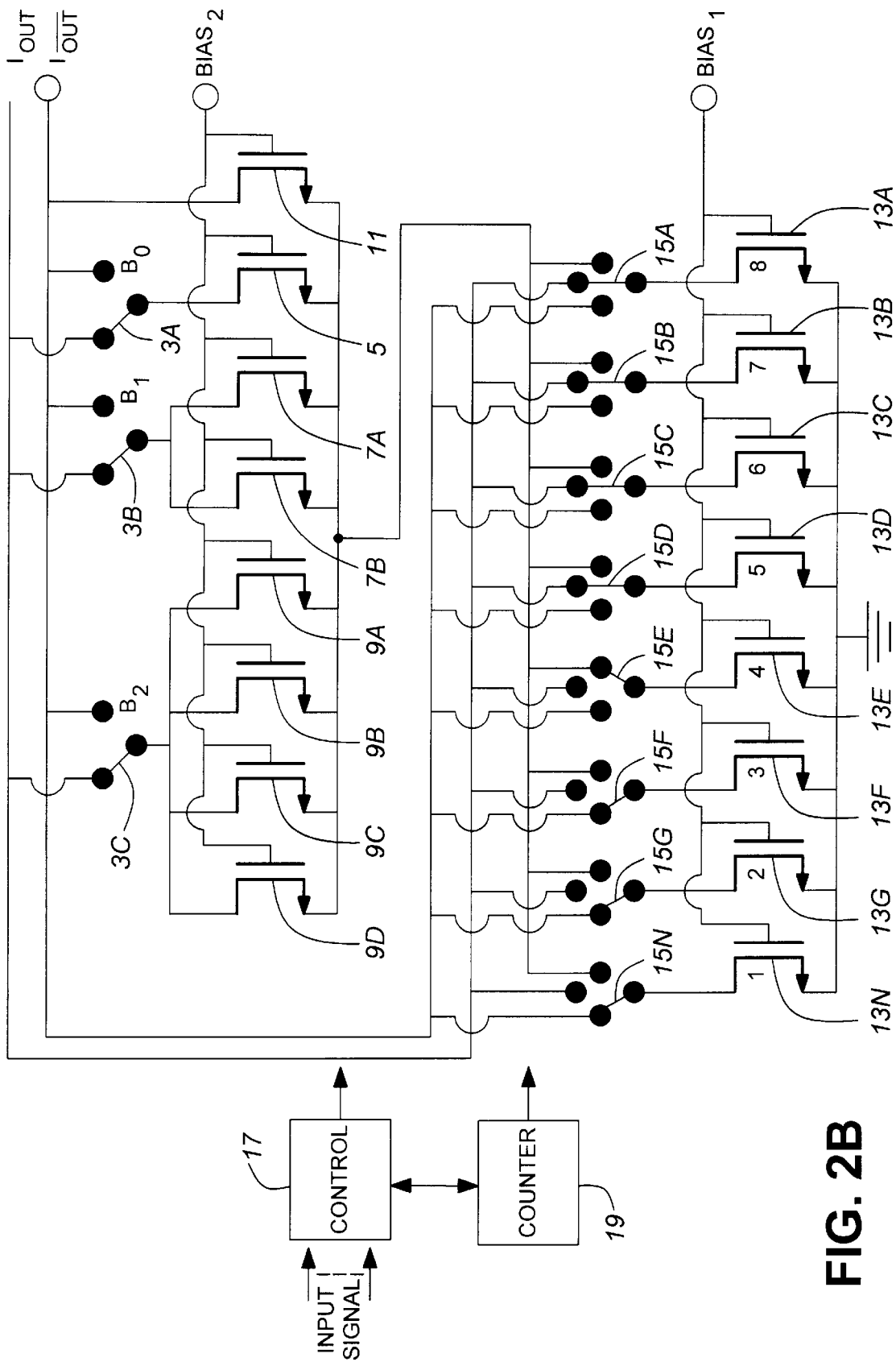

FIG. 2B represents the status of the circuit in the presence of the next input signal code. As an example, the code can be 100111. The three most significant bits (100) have value 4. With the counter 19 indicating the initial value 3 to the control 17, the control causes the next (the fourth) current source to be switched to the common source of the FETs of DAC 1, i.e. switch 15E switches FET 13E to control DAC 1.

The counter, now storing the value 4 as the value of the most significant bits of this second input signal, provides this to the control, which causes the four switches 15D, 15C, 15B and 15A which follow switch 15E to switch the corresponding FETs 13D, 13C, 13B and 13A to the output Iout.

The counter prepares for the next input signal, and stores the sum of the original count and the number of switches switched for the just described signal, i.e. (3+(1+4))=8. This will be the base unit current source address from which the next unit source addresses determined from the most significant bits of the next input signal will be counted. Since there are 8 unit current sources in this example, the next switch to be connected to the common sources of the FETs of DAC 1 will be switch 15N again.

It should be noted that the above described combination of a segmented DAC and data weighted average circuit to provide an improved DAC, can be implemented using either current sources for current steering as shown in the drawings, or by capacitors, for a switched capacitor DAC. In the latter case the FETs are substituted by capacitors to which a charging circuit is coupled. Therefore the term sources or current sources should be construed to alternatively mean charged capacitors.

A person understanding this invention may now conceive of alternate embodiments and enhancements using the principles described herein. All such embodiments and enhancements are considered to be within the spirit and scope of this invention as defined in the claims appended hereto.

What is claimed is:

1. A method of digital to analog conversion comprising:
   (a) switching binary weighted groups of first current sources of a first array of sources to an output in accordance with least significant bits of a digital input signal,
   (b) driving the binary weighted groups with a driving current source selected from a second group of current sources in accordance with a counter value which is based on a value of most significant bits of the input signal added to an immediately preceding counter value, and
   (c) driving an output with current sources from said second ground of current sources which are addressable consecutively to said driving current source.

2. A segmented digital to analog converter (DAC) comprising:
   (a) a first array of current sources,
   (b) a first plurality of switches for switching binary weighted groups of said first array to an output in accordance with least significant bits of a digital input signal comprised of N most significant and M least significant bits,
   (c) a second array of current sources,
   (d) a circuit for switching one of the sources of the second array of sources via a second plurality of switches to drive the first array of sources, and for switching other sources of the second array of sources to the output, the number of said other sources being equal to the value of the N most significant bits of the input signal, and
   (e) addresses of the switched sources being dependent on both a value of N plus the highest address of the previously switched sources.

3. A DAC as defined in claim 2, in which said other sources switched to the output, immediately follow in numeric sequence said one of the sources of the second array of sources which drives the first array of sources.

4. A DAC as defined in claim 3 in which said one of the sources of the second array of sources is designated to be one immediately following a last of an address sequence of said other sources switched to the output.

5. A DAC as defined in claim 4, in which said other sources switched to the output, immediately follow in address sequence said one of the sources of the second array of sources which drives the first array of sources.

6. A DAC as defined in claim 5 in which at least one array of the first and second array of sources is comprised of one of current sources.

7. A DAC as defined in claim 2 in which at least one array of the first and second array of sources is comprised of one of current sources.

8. A digital to analog conversion circuit comprising:
   (a) binary weighted switched current sources controlled by the M least significant bits of a digital input signal comprised of N most significant bits and M least significant bits,
   (b) a data weighted averaging (DWA) stage comprised of an array of separately switchable unit current sources,
   (c) a circuit for causing switching of unit current sources to an output and causing one unit source to drive the binary weighted switched current sources, the number and designation of the unit current sources switched being dependent on the value of the N most significant bits of the input signal combined with a designation of unit current sources previously switched.

9. A DAC circuit as defined in claim 8, in which the designation of the unit current sources switched is indicated by a value of a previous designation stored in a counter added to value of the N most significant bits of the input signal.

* * * * *